United States Patent
Meschke et al.

(10) Patent No.: US 10,201,105 B2
(45) Date of Patent: Feb. 5, 2019

(54) COMBINATION INJECTION MOLDING AND HYDROFORMING

(71) Applicant: Apple Inc., Cupertino, CA (US)

(72) Inventors: Andrew J. Meschke, San Jose, CA (US); Benjamin Shane Bustle, Cupertino, CA (US); Derek C. Krass, San Francisco, CA (US); Thomas Johannessen, Fjerdingby (NO)

(73) Assignee: APPLE INC., Cupertino, CA (US)

( * ) Notice: Subject to any disclaimer, the term of this patent is extended or adjusted under 35 U.S.C. 154(b) by 162 days.

(21) Appl. No.: 15/140,177

(22) Filed: Apr. 27, 2016

(65) Prior Publication Data

US 2016/0368189 A1 Dec. 22, 2016

Related U.S. Application Data

(60) Provisional application No. 62/183,129, filed on Jun. 22, 2015, provisional application No. 62/202,672, filed on Aug. 7, 2015.

(51) Int. Cl.
| | |
|---|---|
| B29C 45/14 | (2006.01) |
| H05K 5/04 | (2006.01) |
| B29L 9/00 | (2006.01) |
| B29L 31/34 | (2006.01) |
| B21D 26/02 | (2011.01) |

(Continued)

(52) U.S. Cl.
CPC ........... *H05K 5/04* (2013.01); *B29C 45/1418* (2013.01); *B21D 26/02* (2013.01); *B29C 45/14377* (2013.01); *B29C 45/1679* (2013.01); *B29C 2043/189* (2013.01); *B29C 2043/3238* (2013.01); *B29C 2791/007* (2013.01);

(Continued)

(58) Field of Classification Search
CPC ..... B23P 11/022; B21D 39/203; B21D 26/02; B21D 15/10; B60G 2206/8107; B29C 2791/007; B29C 2043/189; B29C 43/184; B29C 2043/3238; B29C 45/1418; B29C 45/14377; B29C 45/1679; Y10T 29/49805
See application file for complete search history.

(56) References Cited

U.S. PATENT DOCUMENTS 5,354,397 A * 10/1994 Miyake ............... B29C 45/1418
156/77
5,453,240 A * 9/1995 D'Hooren ............. B29C 43/184
264/154

(Continued)

*Primary Examiner* — Jermie Cozart
(74) *Attorney, Agent, or Firm* — Brownstein Hyatt Farber Schreck, LLP

(57) ABSTRACT

Manufacturing methods that combine molding processes and shaping processes are described. The systems and methods described can be used to form composite parts using a single manufacturing process. In some embodiments, the methods involve positioning a workpiece within a mold cavity, then injecting a moldable material within the cavity at pressures sufficient to deform the workpiece such that features, such as protrusions or cavities, are formed within the workpiece. The resultant composite part includes the workpiece molded to a molded material. In some embodiments, the workpiece is a layer of metal material and the molded material is a structurally rigid plastic material, such that the composite part is a structurally rigid plastic with a metal coating. In some embodiments, multiple workpieces are molded within a composite part.

20 Claims, 17 Drawing Sheets

(51) Int. Cl.
  *B29C 43/18* (2006.01)
  *B29C 43/32* (2006.01)
  *B29C 45/16* (2006.01)

(52) U.S. Cl.
  CPC ....... *B29L 2009/00* (2013.01); *B29L 2031/34* (2013.01); *Y10T 29/49805* (2015.01)

(56) References Cited

U.S. PATENT DOCUMENTS

| | | | |
|---|---|---|---|
| 5,484,566 A * | 1/1996 | Gabbard | B29C 43/146 264/250 |
| 5,551,141 A * | 9/1996 | De'Ath | B29C 45/1418 264/267 |
| 8,477,506 B2 | 7/2013 | Moncrieff | |
| 9,125,293 B2 | 9/2015 | Snider et al. | |
| 2003/0018407 A1 | 1/2003 | Varma | |
| 2008/0292851 A1* | 11/2008 | Egerer | B29C 43/18 428/196 |

* cited by examiner

COMBINATION INJECTION MOLDING AND HYDROFORMING

CROSS REFERENCE TO RELATED APPLICATION

This application claims the benefit of priority under 35 U.S.C § 119(e) to U.S. Provisional Application No. 62/183,129, entitled "COMBINATION INJECTION MOLDING AND HYDROFORMING," filed on Jun. 22, 2015, and to U.S. Provisional Application No. 62/202,672, entitled "COMBINATION INJECTION MOLDING AND HYDROFORMING," filed on Aug. 7, 2015, each of which is incorporated by reference herein in its entirety.

FIELD

This disclosure relates generally to injection molding systems and methods. In particular, injection molding systems and methods that involve intentional deformation of a workpiece, similar to hydroforming techniques, are described.

BACKGROUND

Injection molding is a process that involves injecting a moldable material, such as thermoformable resin, into a mold under pressure such that a resultant part has a shape conforming to a mold cavity of the mold. After the moldable material cools and solidifies, the part is removed from the mold.

Hydroforming is a process whereby a pressurized hydraulic fluid is applied to a ductile material such as some metals to shape the material. Hydroforming is typically used to shape tubing and other large structures. After the forming process is complete, the hydraulic fluid is removed from the shaped part. Combining aspects of injection molding and hydroforming techniques can improve manufacturing efficiency and cost of some product lines.

SUMMARY

This paper describes various embodiments that relate to manufacturing methods that combine molding processes and shaping processes. The systems and methods described can be used to form composite parts using a single manufacturing process.

According to one embodiment, a method of forming a composite part is described. The method includes positioning a workpiece within a mold cavity of a mold. The method also includes injecting a moldable material within the mold cavity such that an applied pressure exerted on the workpiece by the moldable material deforms the workpiece to take on a predetermined shape. The moldable material bonds with the workpiece to form the composite part.

According to another embodiment, a method of forming a composite part is described. The method includes injecting a polymer material into a mold cavity of a mold such that a flow of polymer material is directed toward a surface of a workpiece positioned within the mold cavity. An applied pressure associated with the flow deforms the workpiece to create a protruding feature on the workpiece corresponding to a recessed feature of the mold.

According to a further embodiment, an enclosure for an electronic device is described. The enclosure includes a polymer base that includes a protruding feature integral to the polymer base. The enclosure also includes a cosmetic coating that covers at least a portion of a surface of the polymer base, wherein the cosmetic coating continuously covers the protruding feature.

According to an additional embodiment, an enclosure for an electronic device is described. The enclosure includes an exterior layer having a recessed feature. The enclosure also includes a polymer base bonded to the exterior layer. The polymer base has a protruding feature, wherein the recessed feature surrounds the protruding feature of the polymer base.

These and other embodiments will be described in detail below.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

Described herein are manufacturing processes that involve coupling a moldable material with a workpiece while simultaneously changing a shape of the workpiece. Methods involve injecting the moldable material within a mold such that a flow of the moldable material is directed at a surface of the workpiece and at an applied pressure sufficiently high to deform the workpiece to a predetermined shape. The methods can involve deforming the workpiece in a controlled manner to reduce the formation of cosmetic defects within the workpiece.

One of the advantages of the methods described herein over conventional injection molding processes is that a shape of the workpiece is intentionally changed during the injection molding process. Thus, injection molding and shaping can be accomplished in a single manufacturing process. One of the differences of the some of the procedures described herein and hydroforming processes is that hydroforming fluid does not remain bonded to a workpiece. That is, the hydraulic fluid used in hydroforming is only used as a medium to apply pressure and deform a metal material. In contrast, the moldable material in embodiments described herein is applied at pressures sufficient to deform a workpiece, and also becomes bonded with the workpiece as part of the final composite part.

It should be noted that the methods described herein differ from insert molding techniques. Insert molding involves molding plastic material around an insert such the insert become integrated within the part. In insert molding, care is taken to assure that the molding process does not deform the insert. Unlike insert molding, the embodiments described herein involve intentionally deforming a workpiece by the molding process. In particular, embodiments, the workpiece is deformed in a manner such that the workpiece takes on a predetermined shape.

Methods described herein are well suited for manufacture of consumer products. For example, the methods described herein can be used to form housings or components for computers, portable electronic devices, wearable electronic devices, and electronic device accessories, such as those manufactured by Apple Inc., based in Cupertino, Calif.

These and other embodiments are discussed below with reference to FIGS. 1A-13B. However, those skilled in the art will readily appreciate that the detailed description given herein with respect to these Figures is for explanatory purposes only and should not be construed as limiting.

Figure 1A:
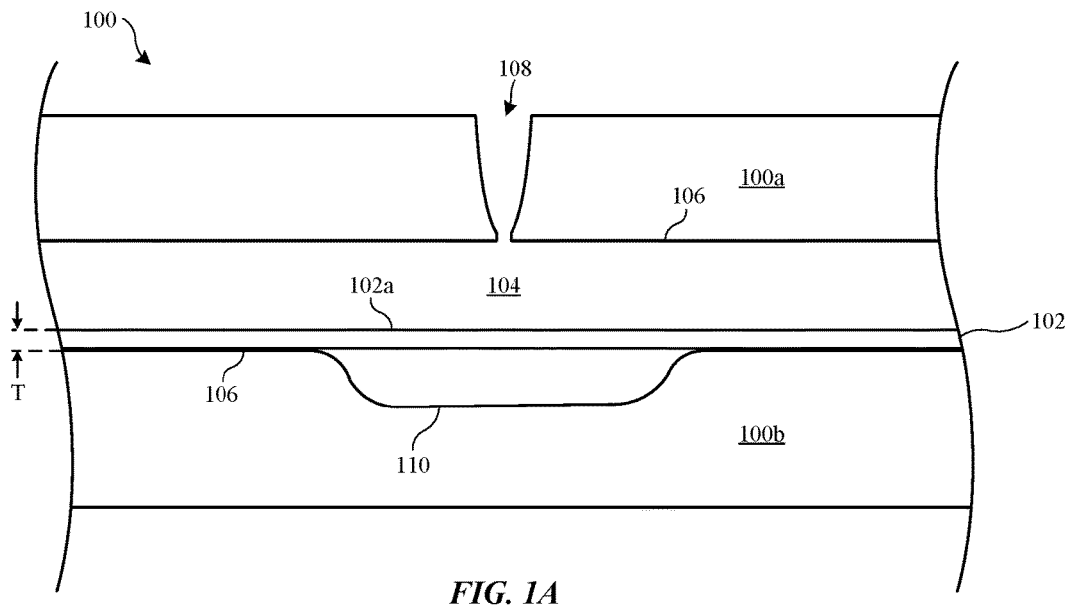
FIGS. 1A-1D show cross-section views of a composite part being formed using a molding process in accordance with some described embodiments.

FIGS. 1A-1D show cross-section views of a composite part being formed using a molding process in accordance with some described embodiments. FIG. 1A shows a portion of mold 100, which includes first mold portion 100a and second mold portion 100b, prior to an injection molding process. First mold portion 100a and second mold portion 100b together form mold cavity 104 wherein a moldable material is injected. Mold cavity 104 is defined by cavity walls 106. First mold portion 100a includes opening 108 that acts as an inlet into mold cavity 104 for a moldable material. Second mold portion 100b includes mold feature 110 that corresponds to a recess within second mold portion 100b.

Prior to the injection molding process, workpiece 102 is positioned within mold cavity 104. Workpiece 102 can be positioned relative to mold feature 110 such that pressure from injecting a moldable material can causes deformation of workpiece 102 into mold feature 110. In some embodiments, the position of workpiece 102 is secured relative to first mold portion 100a and/or second mold portion 100b to prevent movement of workpiece 102 during a subsequent injection molding process. For example, portions of first mold portion 100a and second mold portion 100b (not shown) can clamp down on and secure workpiece 102. Alternatively or additionally, workpiece 102 can be secured to portions of first mold portion 100a and/or second mold portion 100b using an adhesive (not shown).

Workpiece 102 can be made of any suitable material that is deformable during a subsequent molding process. In some embodiments, workpiece 102 is made of one or more of metal, polymer material, glass, ceramic, and composite materials (e.g., fiberglass). In a particular embodiment, workpiece 102 is made of an aluminum or aluminum alloy. The thickness T of workpiece 102 can vary depending on a number of factors such as the material of workpiece 102 and an amount of pressure that will be applied to workpiece 102 during the subsequent molding process. For example, workpiece 102 that is made of brittle material, such glass and ceramic, may be required to be very thin in order to deform without fracturing. In a particular embodiment, workpiece 102 includes a very thin layer (e.g., 10 to 30 micrometers) of zirconia or other ceramic material, which can be sufficiently deformed without cracking due to its thinness. In some embodiments, workpiece 102 is a metal material that has a thickness T on the scale of millimeters or more.

It should be noted that workpiece 102 can have any suitable shape and is not limited to the substantially flat shape shown in FIGS. 1A-1D. For example, instead of a substantially flat sheet of material, workpiece 102 can have a spherical, oblong, or block shape. In some embodiments, workpiece 102 has a uniform thickness, such as shown in FIGS. 1A-1D, while in other embodiments workpiece 102 has a varied thickness.

In some embodiments, workpiece 102 undergoes one or more preconditioning processes prior to the molding process that can make workpiece 102 more deformable. In some embodiments, the preconditioning process involves heating workpiece 102. For example, brittle materials such as glass and ceramic can be heated to a temperature sufficient to put the glass or ceramic in a moldable and flexible state. Metals and polymer materials can also be heated to make them more moldable. Workpiece 102 is placed within mold cavity 104 while in the moldable state such that when a moldable material is injected into mold cavity 104 and applied pressure to workpiece 102, workpiece 102 conforms to walls 106 of mold 100 without breaking or cracking. In some embodiments, the one or more of first mold portion 100a and second mold portion 100b are configured to heat workpiece 102 while within mold cavity 104. In addition to making workpiece 102 more deformable, heating workpiece 102 may make a subsequently molded moldable material bond more effectively with workpiece 102.

Another type of preconditioning process can include chemical treatment, such as a chemical etching process. In a particular embodiment, surface 102a of workpiece 102 is etched to form an irregular or porous textured surface that can form a more effective bond with a subsequently molded-on moldable material.

Figure 1B:
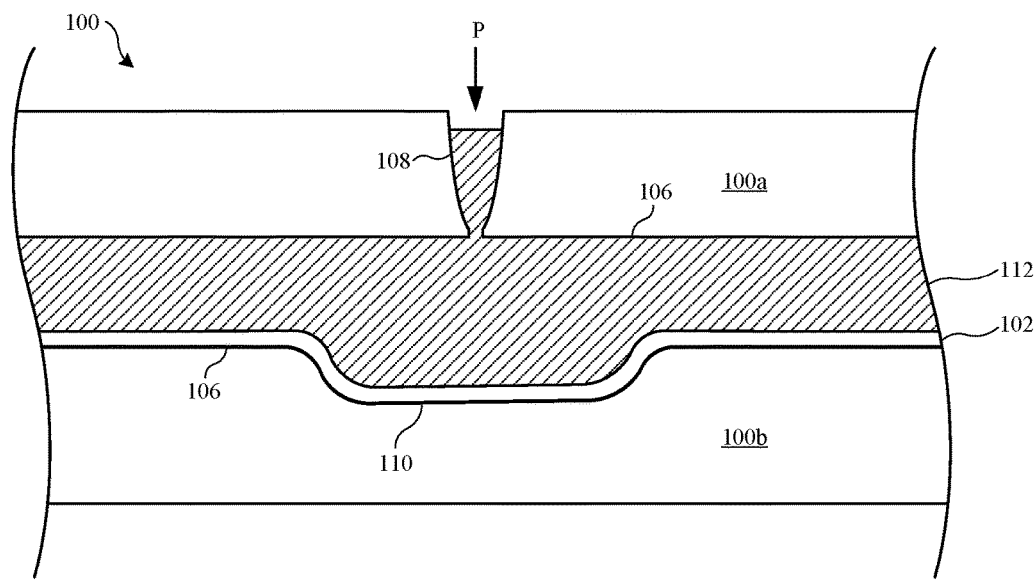

FIG. 1B shows mold 100 during an injection molding process where moldable material 112 is injected into opening 108 and into mold cavity 104. Moldable material 112 is injected within mold cavity 104 at a pressure P sufficient to couple and bind moldable material 112 to workpiece 102. A flow of moldable material 112 is directed toward surface 102a of workpiece 102, and an applied pressure P associated with the flow of moldable material 112 is sufficiently high to deform workpiece 102. In particular, the shape of workpiece 102 changes from a substantially flat shape prior to injection molding to a shape in conformance with second mold portion 100b including mold feature 110. That is, a portion of workpiece 102 is forced into mold feature 110 and takes on a shape in accordance with mold feature 110. In this way, workpiece 102 can take on a predetermined shape defined by mold feature 110.

Moldable material 112 can be made of any suitable material that can be in a flowable state during the molding process. In some embodiments, moldable material 112 is made of one or more of polymer material (e.g., thermoformable resin), metal, glass, ceramic, and composite material. Moldable material 112 should also be made of a material that can bond with workpiece 102 during the injection molding process. Thus, the material of moldable material 112 may depend, in part, on the material of workpiece 102. In particular embodiments, moldable material 112 is made of a polymer material and workpiece 102 is made of a metal material (e.g., aluminum or aluminum alloy).

The pressure P at which moldable material 112 is injected into and applied onto workpiece 102 can vary depending, in part, on the material and thickness T of workpiece 102. The applied pressure P should be sufficiently high to deform workpiece 102 to take on a shape corresponding to the shape of second mold portion 100b. However, too high of pressure P can cause workpiece 102 to tear or create defects within workpiece 102. Thus, the thickness and material strength of workpiece 102 should be taken into consideration. In some cases where workpiece 102 is made of metal, too high of pressures used during the molding process can cause grain elongation of the metal material, which can negatively affect the cosmetic appearance of workpiece 102. For example, workpiece 102 may take on a wavy or rippled appearance. Thus, the applied pressure P can be tuned to achieve sufficient deformation while preventing or mitigating structural or cosmetic defects within workpiece 102.

In some embodiments, a computer simulation program, such as a viscous burst test, may be used to model the formability of workpiece 102 to a desired cavity shape of mold cavity 104. The computer simulation can evaluate variables such as the thickness T of workpiece 102, the shape of mold cavity 104, the pressure of the moldable material, and the temperature of the mold process. The computer simulation can be used to predict an optimal flow rate and pressure of the moldable material during the forming process to reduce cosmetic surface imperfections such as grain elongation as well as prevent defects from forming in workpiece 102.

In some embodiments, the pressure P at which moldable material 112 is applied onto workpiece 102 is done in stepwise manner. For example, initial pressures and speed at which moldable material 112 flows into mold cavity 104 can be relatively low such that workpiece 102 can be allowed to mold into and conform to the shape of mold feature 110 without breaking or tearing. Once workpiece 102 is molded within and substantially in conformance with mold feature 110, the pressure P and speed of flow of moldable material 112 can be increased to densely compact moldable material 112 within mold cavity 104 and against workpiece 102.

Note that since the molding process can involve high pressures, the molding process in itself can create thermal energy that heats workpiece 102 and makes workpiece 102 more deformable compared to room temperature conditions. Thus, in some embodiments, the molding process can add sufficient heat to workpiece 102 to provide good deformation and bonding capability to workpiece 102 such that a preconditioning heating process is not necessary. However, in some embodiments, the thermal energy from the injection molding is not sufficient to heat workpiece 102 to a sufficient temperature for deformation without cracking or breaking workpiece 102. In these cases, the preconditioning heating process can be used to preheat workpiece 102 prior to injection molding. For example, workpiece 102 made of some metal materials may be sufficiently heated during the molding process such that a preconditioning heating process is not needed. However, workpiece 102 made of some glass or ceramic materials may need the preconditioning heating process so that workpiece 102 adequately deforms without cracking. After the injection molding process is complete, moldable material 112 is allowed to cool and harden forming a hardened molded material that is bonded to the workpiece.

Figure 1C:
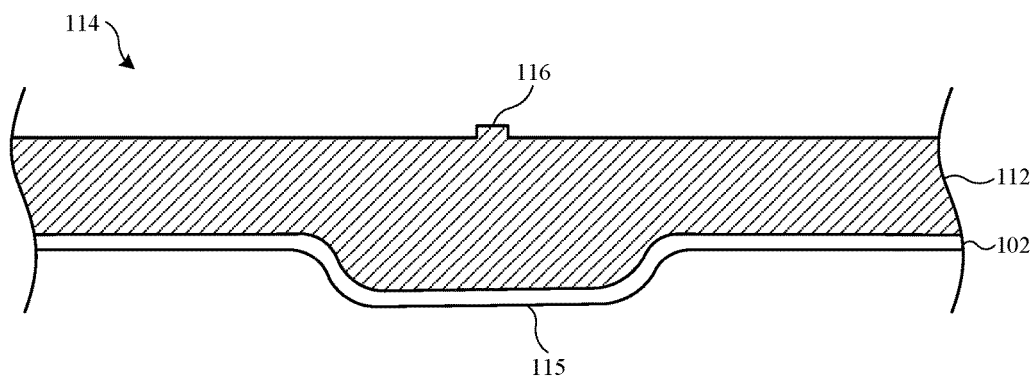

FIG. 1C shows composite part 114 after removal from mold 100. Composite part 114 includes feature 115 that has a shape corresponding to the shape of mold feature 110. In particular, feature 115 is a protruding feature that matches the recessed mold feature 110. In other embodiments, recessed features can be formed within composite part 114 by using a mold with a corresponding protruding feature in a similar manner. As shown, in some embodiments, composite part 114 includes vestige 116 remaining on molded material 112 where moldable material 112 entered mold cavity 104.

Figure 1D:
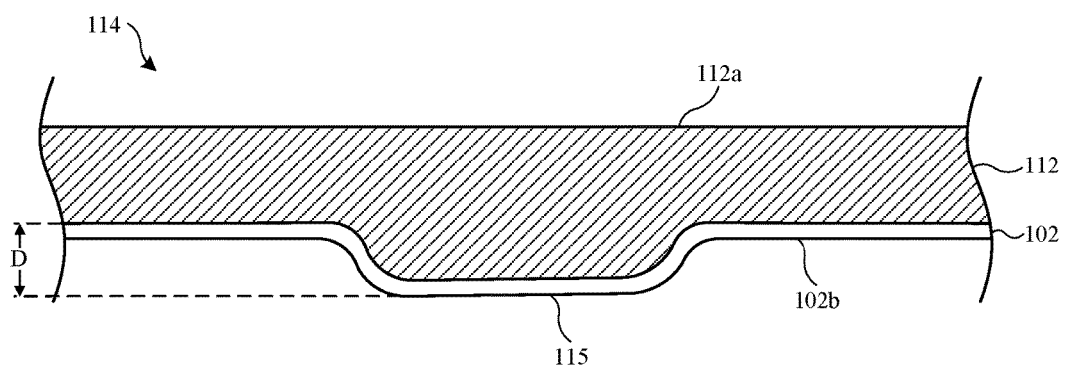

FIG. 1D shows composite part 114 after vestige 116 is removed using one or more machining and/or surface finishing operations (e.g., sanding, polishing or buffing) forming a finished surface 112a. Additionally or alternatively, composite part 114 can undergo a machining operation to provide a final shape to composite part 114 or to form more features (e.g., holes, indentations, etc.) in composite part 114. In some embodiments, workpiece 102 of composite part 114 undergoes a post-molding finishing operation to remove cosmetic inconsistencies caused by the shaping and molding process, such as grain elongation and other cosmetic defect described above. For example, a sanding, polishing and/or buffing operation can be used to smooth out any waviness or rippled appearance as an artifact of the pressurized shaping process.

In some embodiments, composite part 114 is an enclosure, or part of enclosure, for an electronic device. For example, exposed surface 102b of workpiece 102 can correspond to an exterior surface of the enclosure, with surface 112a of molded material 112 corresponding to an interior surface of the enclosure that supports internal components of the electronic device and is hidden from view from a user. In a particular embodiment, workpiece 102 corresponds to a layer of metal material that covers an entire surface, or a portion of a surface, of molded material 112 such that workpiece 102 serves as a cosmetic covering to composite part 114. Molded material 112 can be a structural portion of the enclosure that provides strength and structural integrity to the enclosure.

As described above, one of the advantages the molding processes described herein over conventional injection molding processes is that workpiece 102 can be shaped and molded and material 112 can be coupled to workpiece 102 in one manufacturing process. This is in contrast to conventional processes where workpiece 102 would be shaped in a first manufacturing process, such as a stamping or hydroforming process, and then coupled to molded material 112 in a second manufacturing process, such as an injection molding process. Thus, combining these processes into one manufacturing process, as described herein, saves costs related to manufacturing time and cycle time. In addition, the first and second manufacturing processes would require different tools, e.g., a stamping or hydroforming tool and an injection molding tool. Hence, combining these processes into a single process using one tool can save costs related to additional equipment.

An advantage of the molding processes described herein over conventional machining processes where feature 115 is machined within part 114 is that such machining processes would result in a large amount of material waste. That is, areas of workpiece 102 surrounding feature 115 would have to be machined away and discarded. In contrast, the methods described herein can mainly involve material manipulation rather than bulk material removal, resulting in large cost savings related to material waste.

It should be noted that the volume of feature 115, indicated in FIG. 1D by distance D that feature protrudes from composite part 114, includes both the material of workpiece 102 and molded material 112. This can provide an advantage over situations where the entire volume of feature 115 is only made of workpiece 102. For example, if molded material 112 is made of a material that is more rigid and has more structural strength than the material of workpiece 102, having a portion feature 115 made of molded material can add rigidity and structural strength to feature 115. This can make feature 115 more robust and less easily deformed during the use of composite part 114. For example, in embodiments where composite part 114 is a portion of a housing or enclosure of a portable electronic device, feature 115 would be less likely to be deformed from a drop event.

Figure 2A:
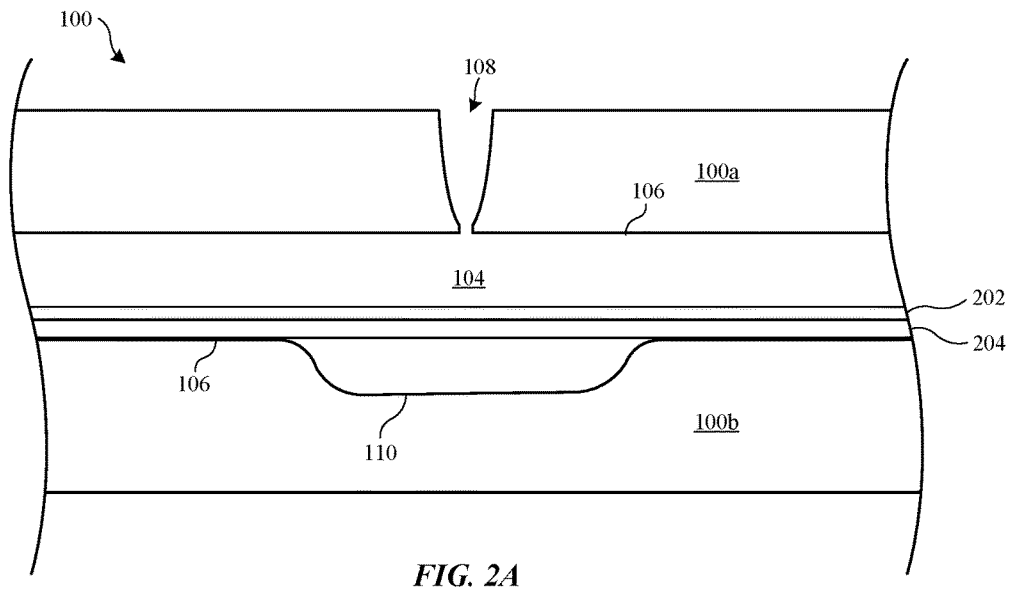
FIGS. 2A-2B show cross-section views of a composite part having multiple workpieces being formed using a molding process in accordance with some described embodiments.
Figure 2B:
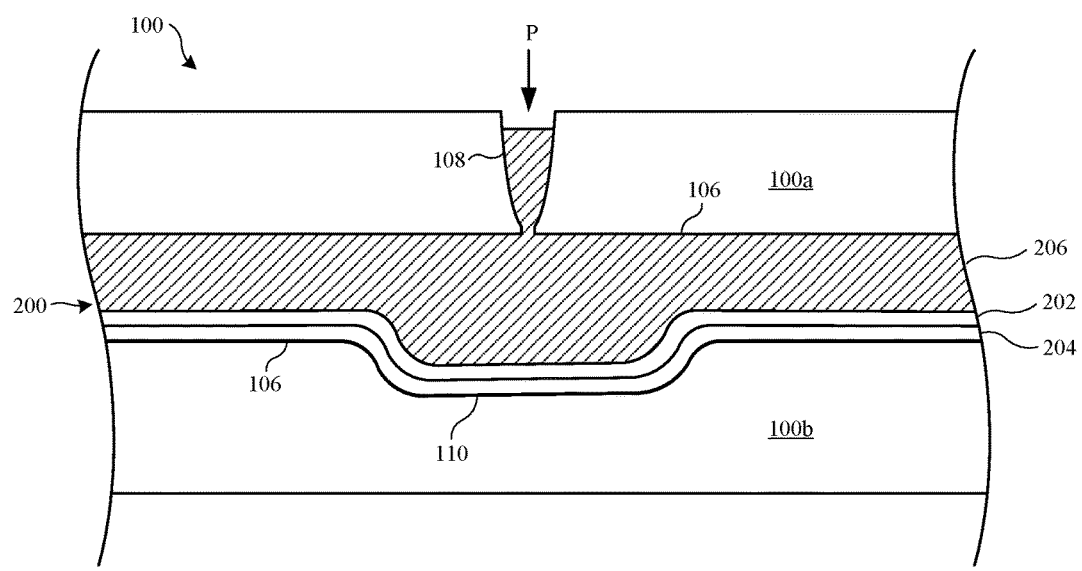

In some embodiments, the methods described herein are used to mold multiple workpieces together, where one or more of the workpieces are intentionally deformed during the injection molding process. FIGS. 2A-2B show cross-section views of composite part 200 having multiple workpieces 202 and 204 being formed using the methods described herein. FIG. 2A shows first workpiece 202 and second workpiece 204 positioned within mold cavity 104 of mold 100. First workpiece 202 and second workpiece 204 can correspond to sheets of material that are stacked together in a laminar form. In some embodiments, an adhesive positioned between first workpiece 202 and second workpiece 204 to adhere first workpiece 202 with second workpiece 204 together. First workpiece 202 and second workpiece 204 can each be made of any suitable material, and can be made of the same material or different materials.

At FIG. 2B, moldable material 206 is injected into mold cavity 104 such that injection pressure P of moldable material 206 is applied onto first workpiece 202 and second workpiece 204 such that first workpiece 202 and second workpiece 204 conform to a shape of second mold portion 100b, including mold feature 110. After the injection molding process is complete and moldable material 206 is hardened, composite part 200 can be removed from mold 100. In some embodiments, second workpiece 204 is made of a cosmetically appealing material and will correspond to a visible portion of composite part 200, with first workpiece 202 made of a more structurally rigid material and cosmetics being of lesser importance since first workpiece 202 can be hidden from view by second workpiece 204 on one side and moldable material 206 on another side. In a particular embodiment, second workpiece 204 is made of an aluminum alloy and first workpiece 202 is made of a stainless steel.

Note that in some embodiments, instead of a laminar configuration where first workpiece 202 and second workpiece 204 are both deformed during the injection molding process, the multiple workpieces includes an insert-molded piece that is not substantially deformed during the injection molding process.

Figure 3A:
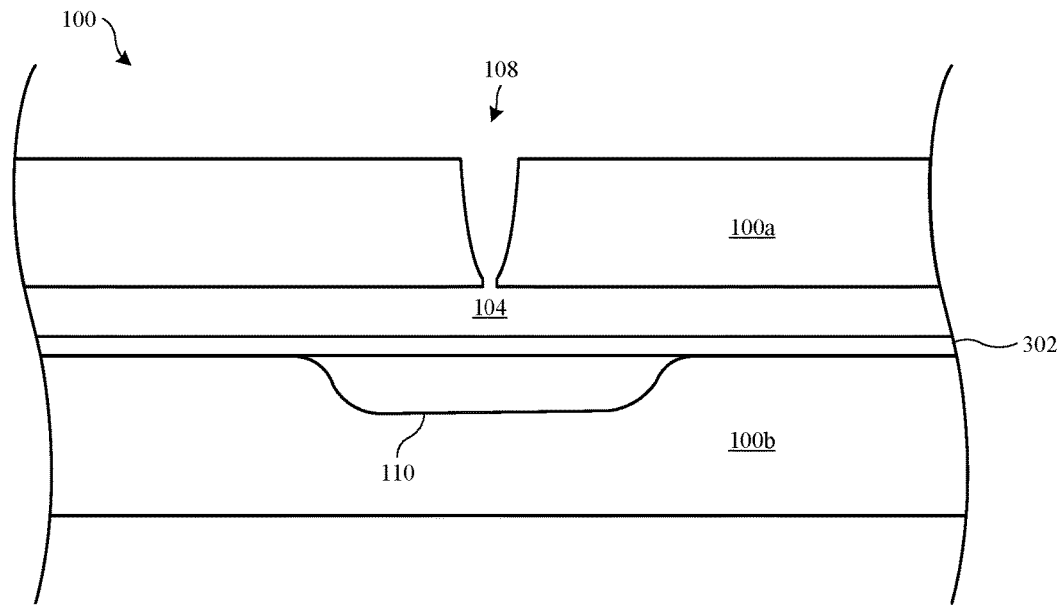
FIGS. 3A-3D show cross-section views of a composite part having multiple molded materials being formed using a molding process in accordance with some described embodiments.
Figure 3B:
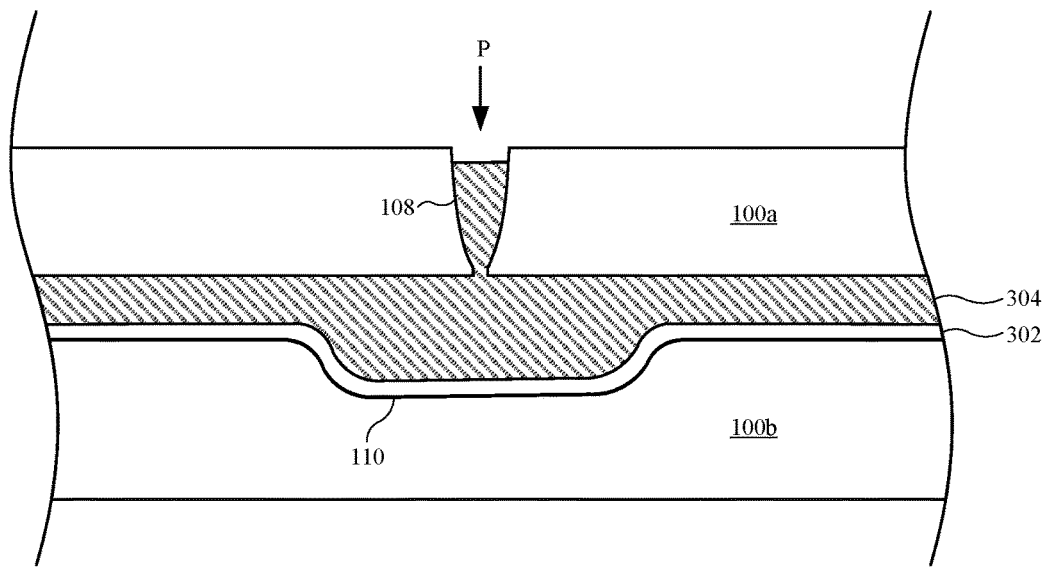

FIGS. 3A-3D show cross-sections views of a composite part being formed using multiple molding operations, in accordance with some embodiments. FIG. 3A shows a cross-section view of first mold 100 with workpiece 302 positioned within mold cavity 104. At FIG. 3B, first moldable material 304 is molded within mold cavity 104 at a prescribed pressure P such that workpiece 302 conforms to second mold portion 100b, including within mold feature 110. After first moldable material 304 is cooled and hardened and sufficiently bonded to workpiece 302, molded material 304 and workpiece 302 are removed from mold 100. In some embodiments, first molded material 304 and workpiece 302 are then subjected to one or more shaping processes (not shown), such as a machining and/or surface finishing operations.

Figure 3C:
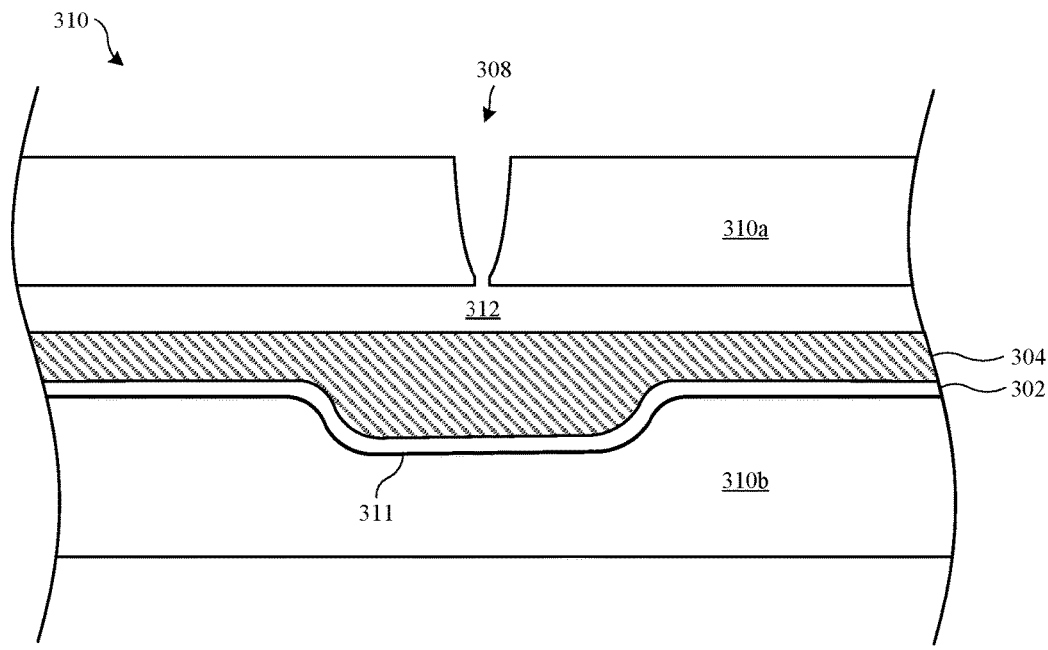

FIG. 3C shows first molded material 304 and workpiece 302 placed into second mold 310, which includes first mold portion 310a and second mold portion 310b, which define a second mold cavity 312. First mold portion 310a has opening 308, which is configured to accept a second moldable material during an injection molding process. Second mold portion 310b includes mold feature 311 that is shaped to accept shaped workpiece 302.

Figure 3D:
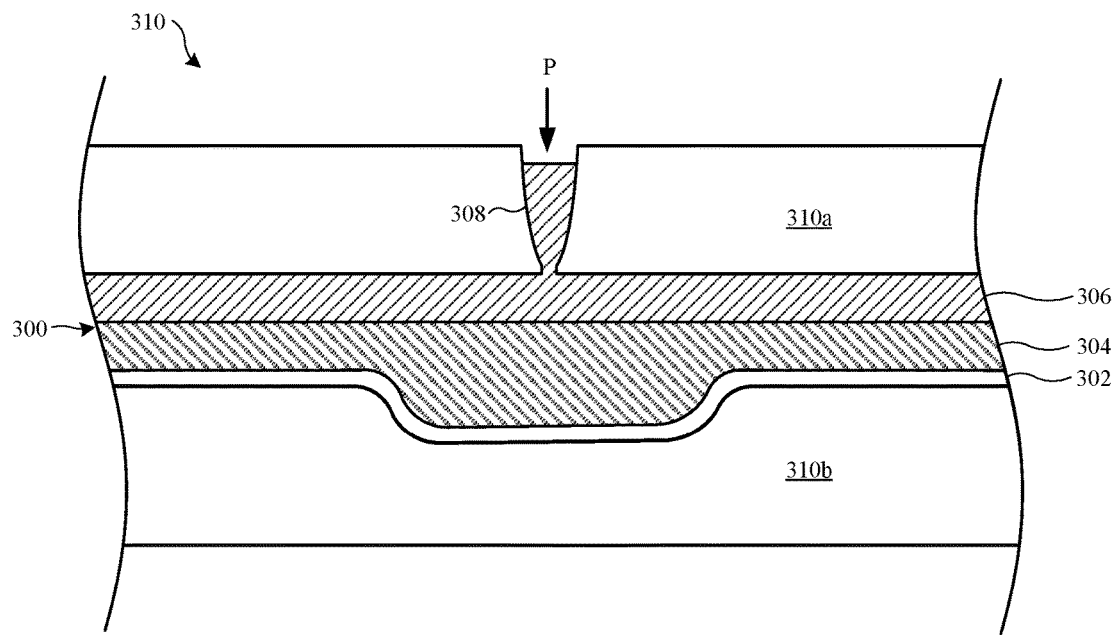

FIG. 3D shows second moldable material 306 injected into second mold cavity 312, thereby forming composite part 300. As shown, first moldable material 304 become sandwiched between second moldable material 306 and workpiece 302. In some embodiments, first moldable material 304 is made of the same material as second moldable material 306. In other embodiments, first moldable material 304 is made of a different material than second moldable material 306. In some embodiments, first moldable material 304 is made of a more rigid material than second moldable material 306, and second moldable material 306 is made of a more cosmetically appealing material than first moldable material 304. After second moldable material 306 is sufficiently hardened, composite part 300 is removed from second mold 310.

Figure 4A:
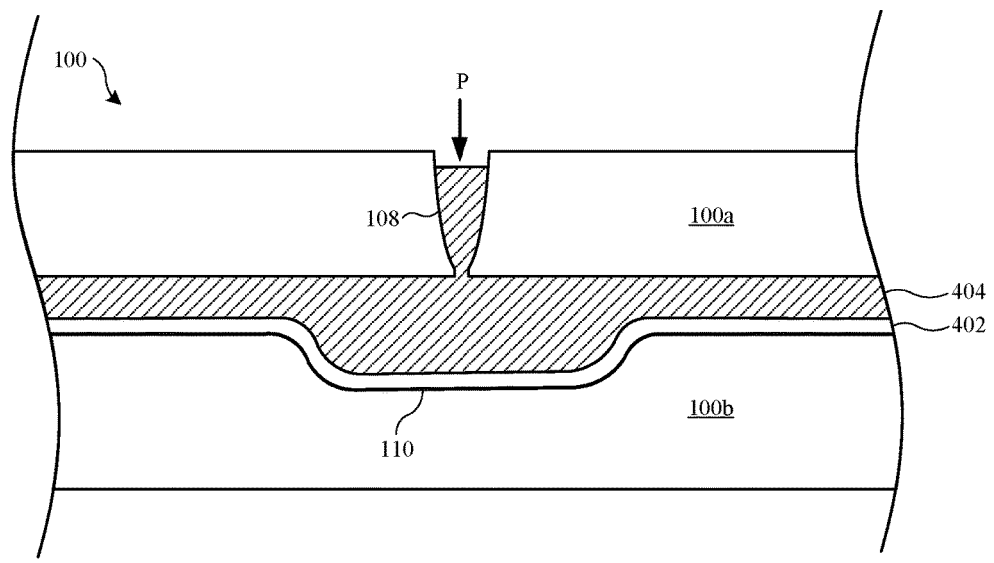
FIGS. 4A-4D show cross-section views of another composite part having multiple workpieces and molded parts being formed using a molding process in accordance with some described embodiments.

FIGS. 4A-4D show cross-section views of a composite part having multiple molded materials and multiple workpieces being formed using methods described herein. FIG. 4A shows first mold 100 with first workpiece 402 being deformed during an injection molding process where first moldable material 404 is molded onto first workpiece 402 at a prescribed pressure P. During the molding process, first workpiece 402 is deformed so as to conform to the shape of mold feature 110. After first moldable material 404 is cooled and hardened, first moldable material 404 and first workpiece 402 are removed from first mold 100.

Figure 4B:
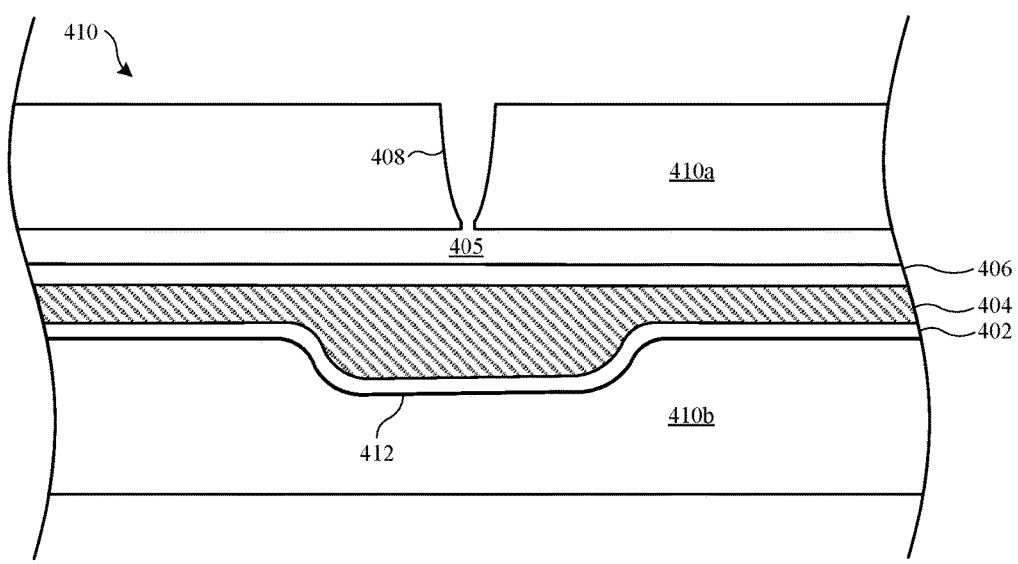

FIG. 4B shows first molded material 404 and first workpiece 402 positioned within second mold 410, which includes first mold portion 410a and second mold portion 410b. First mold portion 410a includes opening 407 as an inlet for a second moldable material. Second mold portion 410b includes mold feature 412, which is configured to accommodate the shape of first workpiece 402. First mold portion 410a and second mold portion 410b define second mold cavity 405. Second workpiece 406 is positioned second mold cavity 405 adjacent to first molded material 404.

Figure 4C:
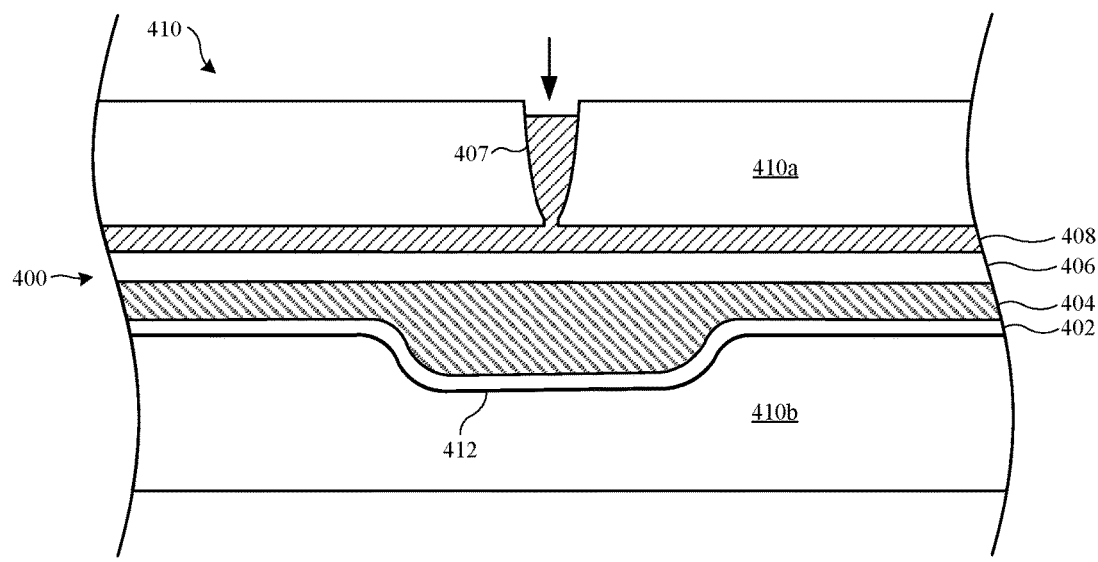
Figure 4D:
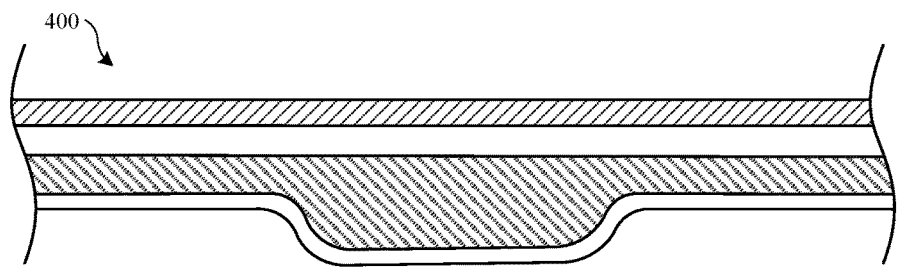

FIG. 4C shows second moldable material 408 injected into second mold cavity 405, thereby forming composite part 400. As shown, first molded material 404 and second workpiece 406 become sandwiched between second moldable material 408 and first workpiece 402. In some embodiments, each of first workpiece 402, first molded material 404, second workpiece 406, and second moldable material 408 are made of different materials that attribute different structural or cosmetic qualities to composite part 400. For example, first molded material 404 and second workpiece 406 can provide structural support for composite part 400, while workpiece 402 and second moldable material 408 provide cosmetic attributes to composite part 400. FIG. 4C shows composite part 400 after removal from second mold 410. Composite part 400 can optionally undergo one or more post-molding machining and/or surface finishing processes.

It should be noted that composite structures and methods described herein are not limited to those described above with reference to FIGS. 1A-4C, and that variations of these can fall within the scope of the inventions described herein. In addition, any suitable combination of the composite structures and methods described above with reference to FIGS. 1A-4C can be used.

Figure 5:
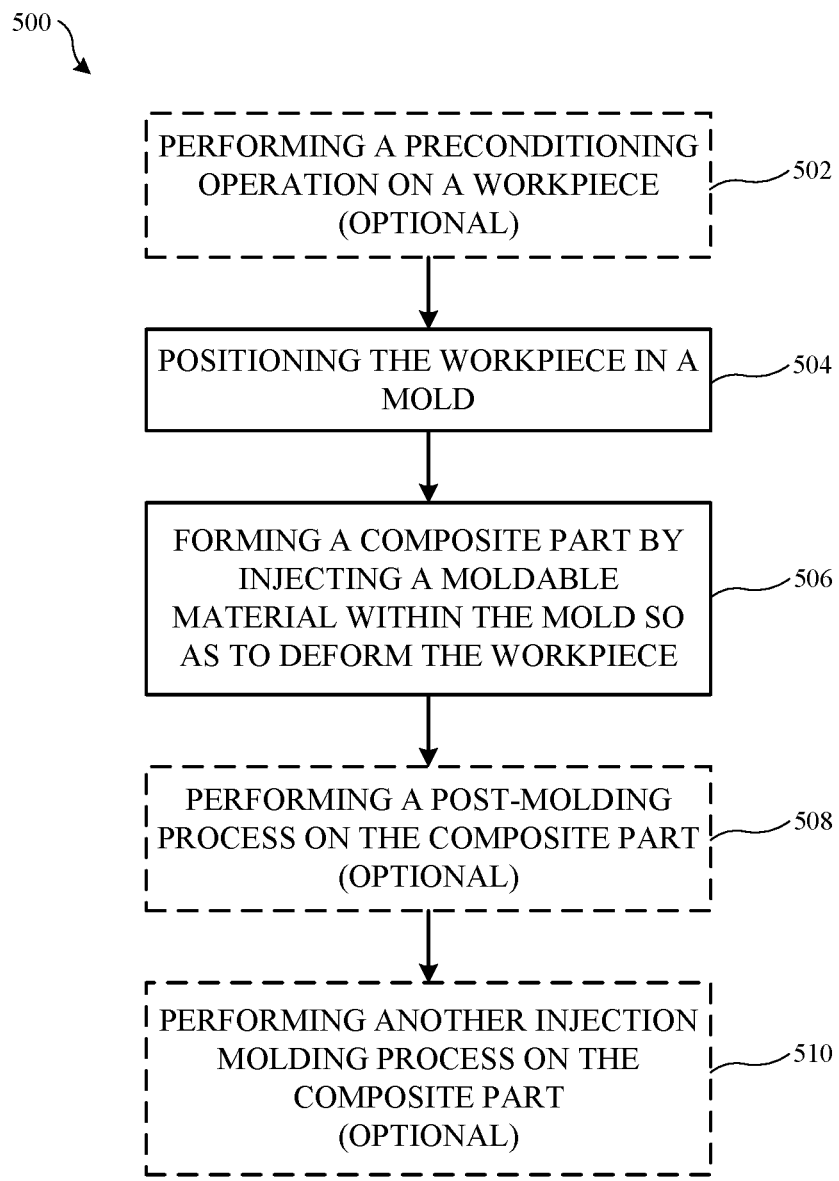
FIG. 5 shows a flowchart that indicates a process for forming composite part using a molding process in accordance with described embodiments.

FIG. 5 shows flowchart 500 indicating a process for forming a composite part in accordance with some described embodiments. At 502, a preconditioning operation is optionally performed on a workpiece. The preconditioning can include one or more processes that make the workpiece more moldable and flexible for shaping during a subsequent molding operation. Additionally or alternatively, the preconditioning includes one or more processes that improve bonding with a subsequently molded-on moldable material. Suitable preconditioning operations can include heating the workpiece and/or exposing the workpiece to a surface etching process (e.g., chemical or laser etching).

At 504, the workpiece is positioned in a mold. In some embodiments, two or more workpieces are placed within the mold. The mold includes walls that define a shape of the composite part. The workpiece can be positioned proximate to a mold feature, such as a recess or protrusion of the mold, so that the workpiece will deform in accordance with a shape of the mold feature. The mold can be designed to secure the workpiece during a subsequent injection molding process.

At 506, a moldable material is injected within the mold so as to deform the workpiece and bond with the workpiece, thereby forming the composite part. In this way, the molding process accomplished two manufacturing tasks in one manufacturing operation: shaping the workpiece and bonding the moldable material with a moldable material. If two or more workpieces are used, the two or more workpieces are coupled together by the moldable material. Materials of each of the moldable material and the workpiece can be chosen based on desired cosmetic and/or structural qualities. In some embodiments, the workpiece is metal (e.g., aluminum alloy) and is chosen based on cosmetic appearance and durability, while the moldable material is a polymer material chosen based on structural soundness and rigidity. After the moldable material is hardened, the composite part can be removed from the mold.

At 508, a post-molding process is optionally performed on the composite part. The post-molding process can include one or more shaping operations to create a final shape of the composite part. For example, surfaces of the composite part can be machined and/or finished to remove molding vestiges, grain irregularities, and other cosmetic defects from the molding process. In some embodiments, features such as holes and designs are formed on the composite part.

At 510, another injection molding process is optionally performed on the composite part. The additional molding process can include molding on a second moldable material onto the composite part. In some embodiments, a second workpiece is also incorporated into the composite part during the second molding operation.

Figure 6A:
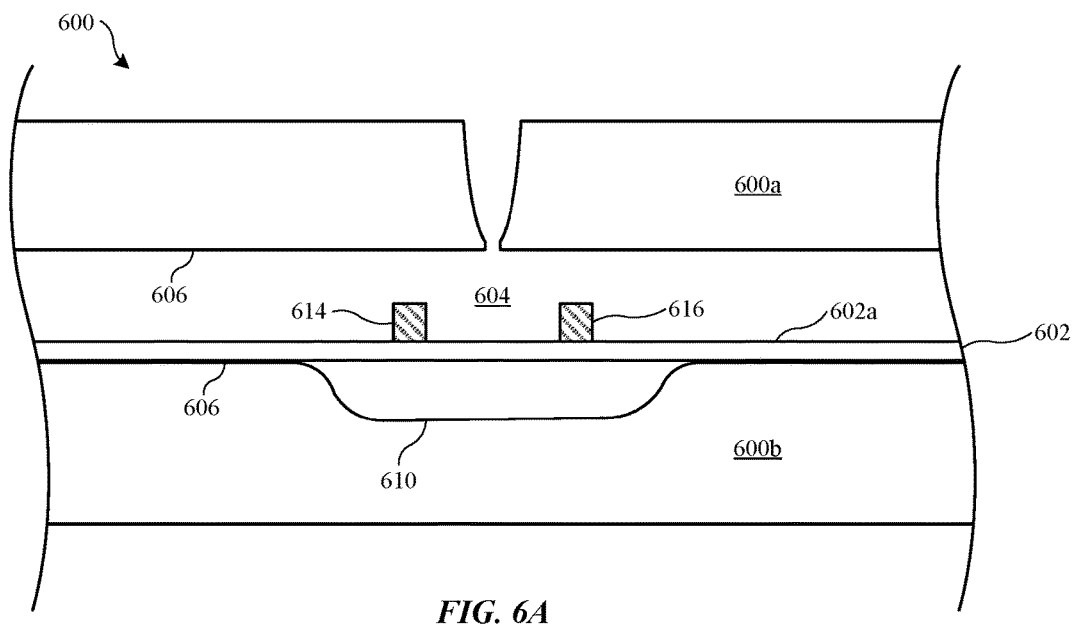
FIGS. 6A-6B show cross-section views of a composite part having an insert being formed using a molding process in accordance with some described embodiments.
Figure 6B:
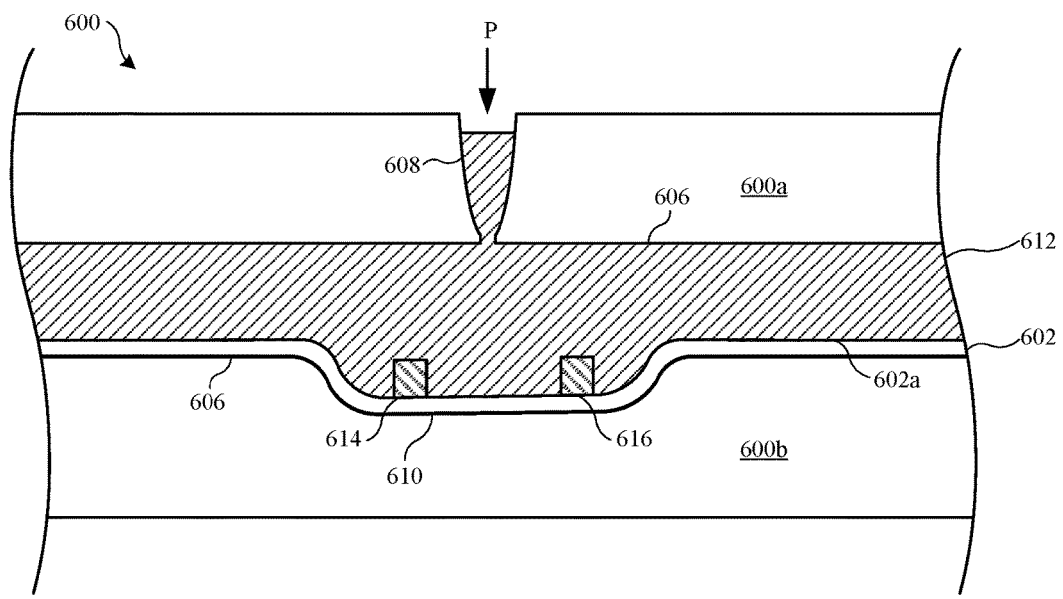

FIGS. 6A and 6B show cross-section views of formation of a composite part using methods described above with insert molding. FIG. 6A shows mold 600 with workpiece 602 positioned therein prior to the molding process. Workpiece 602 has features 614 and 616 that can be positioned on surface 602a of workpiece 602 or partially within workpiece 602. Features 614 and 616 can be located in an area between first mold portion 600a and second mold portion 600b. In some cases, features 614 and 616 are situated where workpiece 602 is deformed during the molding process in conformance with mold feature 610, which is defined by cavity walls 606.

Features 614 and 616 can be made of any suitable material depending on a desired function of features 614 and 616. In some embodiments, features 614 and 616 are made of one or more of metal, polymer material, glass, ceramic, and composite materials (e.g., fiberglass). Features 614 and 616 can be part of workpiece 602, or features 614 and 616 can be additional components positioned on surface 602a of workpiece 602 prior to the molding process. In some embodiments, features 614 and 616 are formed from workpiece 602 through any suitable method, such as machining of workpiece 602. In further embodiments, features 614 and 616 are secured to surface 602a of workpiece 602, for example, using one or more of adhesive, welding, form fitting, and threaded coupling. In some embodiments, features 614 and 616 are designed to fasten separate components together during the molding process. For example, features 614 and 616 can be housing chassis components, brackets, nuts, and other features designed to fasten components together.

FIG. 6B shows mold 600 during an injection molding process where moldable material 612 is injected through opening 608 against workpiece surface 602a. As a result, features 614 and 616 are over-molded by moldable material 612, and insert molded within moldable material 612. Features 614 and 616 are displaced with workpiece surface 602a as workpiece 602 is deformed to conform to mold cavity 604. Moldable material 612 bonds to workpiece 602 and features 614 and 616 forming a composite part. Features 614 and 616 can increase a bond strength between moldable material 612 and workpiece 602 by increasing the surface area over which moldable material 612 bonds.

In some embodiments, features 614 and 616 are exposed through one or more processes subsequent to the molding process, allowing for access to features 614 and 616. For example, holes can be formed through moldable material 612 to features 614 and 616 using a machining operation. In embodiments where the composite part is a housing for an electronic device, access to features 614 and 616 may allow for fastening to other housing components or functional elements of the electronic device.

Figure 7A:
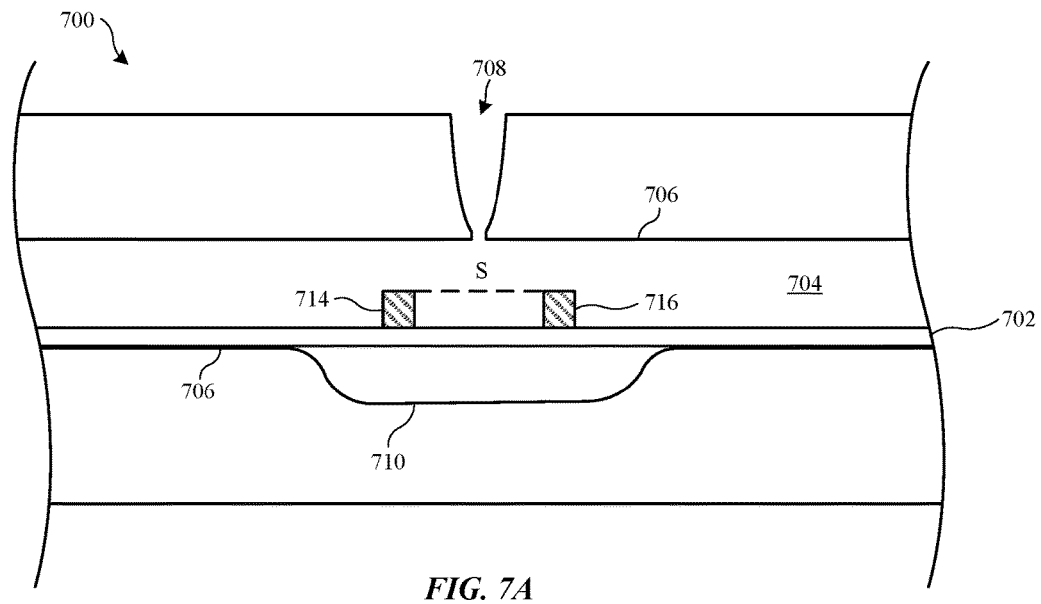
FIGS. 7A-7D show cross-section views of a composite part having antenna elements being formed using a molding process in accordance with some described embodiments.

FIGS. 7A-7D show cross-section views of formation of a composite part having antenna elements. FIG. 7A shows mold 700 having antenna features 714 and 716 separated with respect to each other by separation distance "S" before molding. S can be chosen to allow optimal performance of antenna features 714 and 716 in the final composite part. In some embodiments antenna features 714 and 716 are within an area defined by mold feature 710. In some embodiments, workpiece 702 is made of a metal material than can functionally cooperate with antenna features 714 and 716. In other embodiments, workpiece 702 is made of a radio frequency (RF) transparent material such as plastic, glass or ceramic.

Figure 7B:
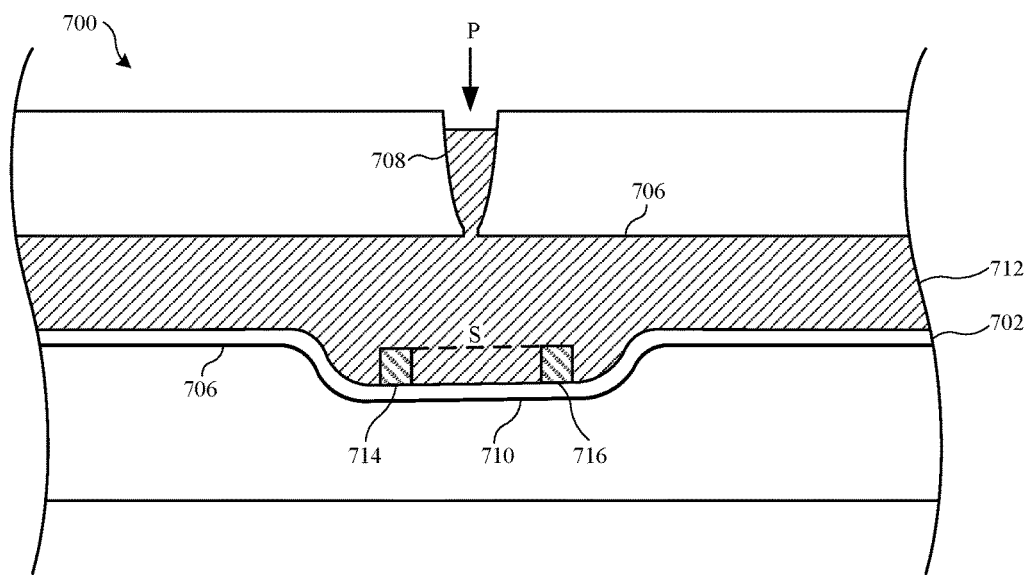

At FIG. 7B, moldable material 712 is molded onto workpiece 702 and antenna features 714 and 716. During the molding process, moldable material 712 is injected into mold cavity 704 through opening 708. Moldable material 712 can be made of an RF transparent material to allow radio access to antenna features 714 and 716 contained within moldable material 712. Relative positioning of antenna feature 714 to antenna feature 716 (separation distance S) can remain constant during the molding process. In some embodiments, the pressure P at which moldable material 712 is applied to workpiece 702 is varied such that deformation of workpiece 702 is minimized during the molding process in order to assure S remains constant. For example, a first lower pressure can be applied to displace the workpiece 702 against mold cavity walls 706, minimally deforming workpiece 702 as it conforms to mold feature 710, then a higher pressure can be applied. By controlling the pressure and rate of deformation, relative positioning of features 614 and 616 can be maintained during the mold process.

In other embodiments, the molding process changes the separation distance S of antenna features 714 and 716 from a pre-molding separation distance to a post-molding separation distance. A pre-molding process separation distance S between antenna features 714 and 716 can be chosen such that the molding process positions antenna features 714 and 716 into a desired post-molding separation distance. The post-molding separation distance may be greater than or less than a pre-molding separation distance.

Figure 7C:
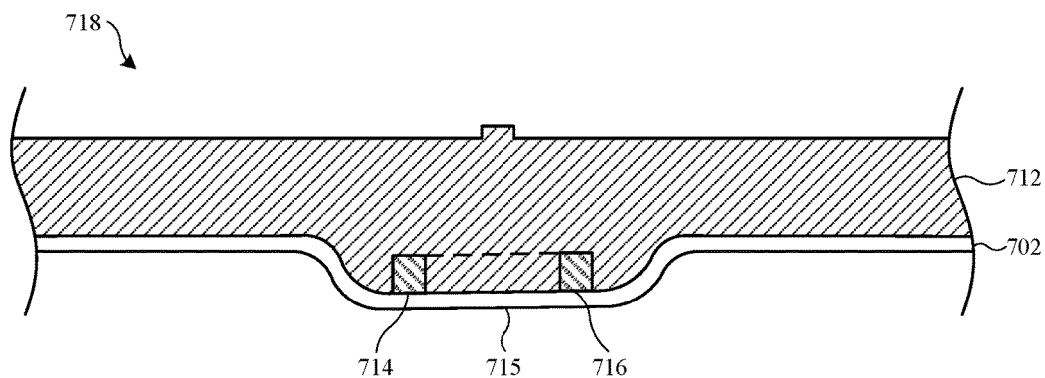
Figure 7D:
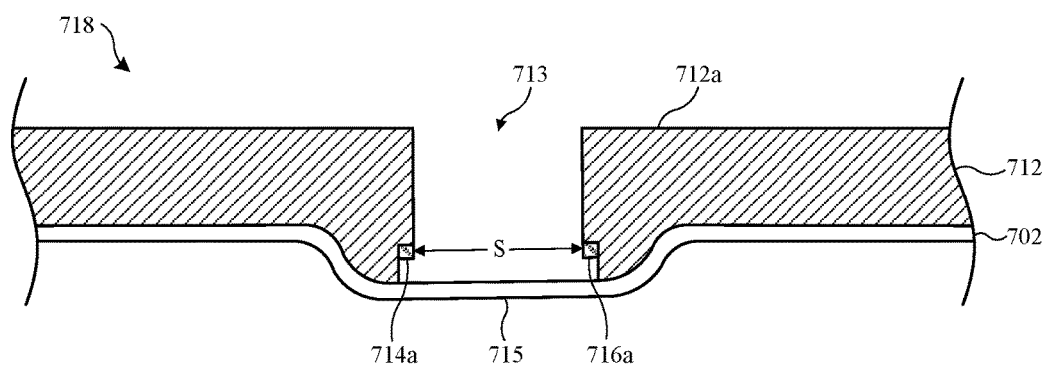

FIG. 7C shows composite part 718 after removal from mold 700 with antenna features 714 and 716 embedded therein. Composite part 718 includes feature 715 that has a shape corresponding to the shape of mold feature 710. In some embodiments, some of moldable material 712 is removed from composite part 718 to expose antenna features 714 and 716 as shown in FIG. 7D. This can be accomplished using any suitable technique, including one or more machining operations. In some embodiments, portions of antenna features 714 and 716 and/or workpiece 702 are also removed. Remaining molding material 712*a* can define cavity 713 that exposes remnant antenna features 714*a* and 716*a* of antenna features 714 and 716. In this way, remnant antenna features 714*a* and 716*a* can be formed within composite part 718 a predefined separation distance S from each other.

Figure 8A:
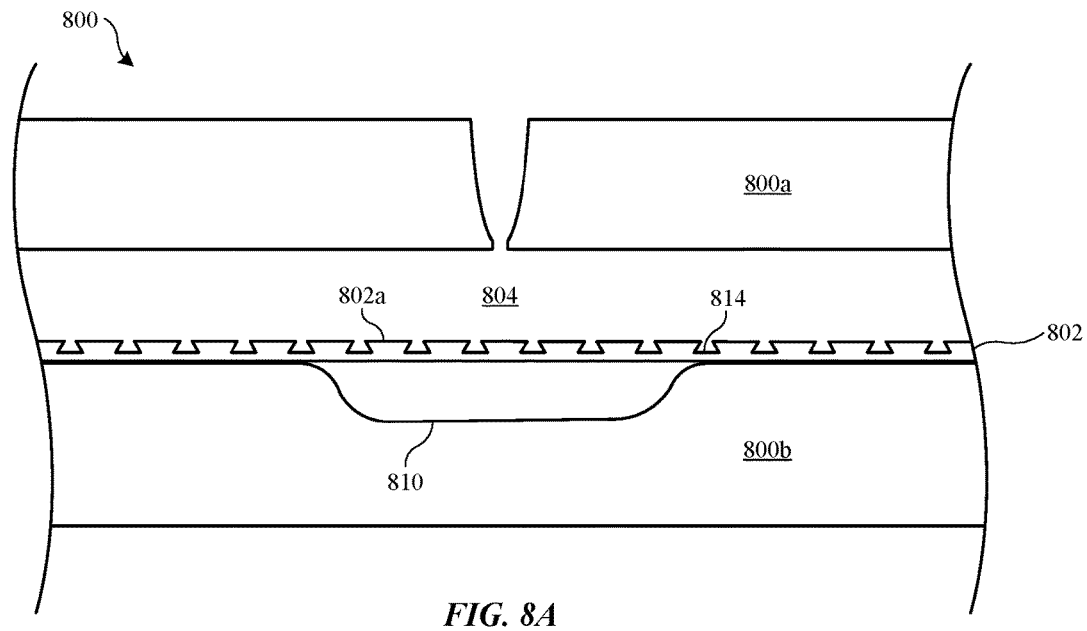
FIGS. 8A-8B show cross-section views of a composite part having mechanical interlocks being formed using a molding process in accordance with some described embodiments.
Figure 8B:
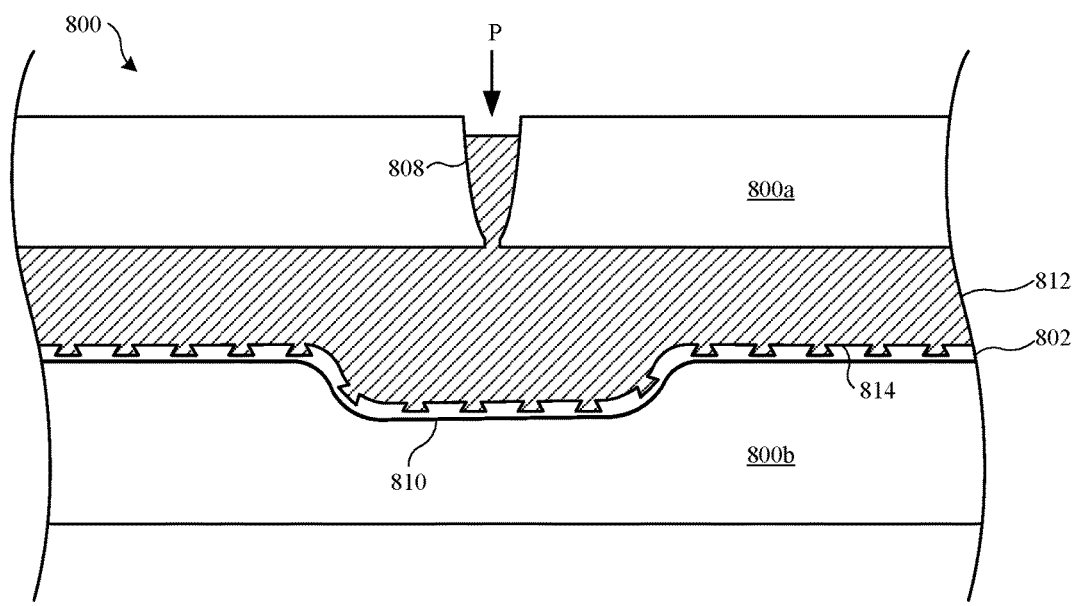

FIGS. 8A and 8B show cross-section views of formation of a composite part using mechanical interlocks. At FIG. 8A workpiece 802 is positioned within mold 800. Workpiece 802 is preconditioned to form mechanical interlocks 814 on surface 802*a* of workpiece 802. Mechanical interlocks 814 can increase the surface area of surface 802*a*, thereby increasing a bond between a subsequent applied moldable material to workpiece 802. In some embodiments, mechanical interlocks 814 have dimensions on the scale of millimeters. Mechanical interlocks 814 can be formed using any suitable method for shaping surface 802*a*, such as machining or etching (e.g., chemical or laser etching). In some embodiments mechanical interlocks 814 are in the form of grooves or pits. In some cases, mechanical interlocks 814 have undercut geometries (as shown) to enhance the bonding between workpiece 802 and the subsequently molded-on moldable material. In particular, mechanical interlocks 814 can have a smaller opening at surface 802*a* than within mechanical interlocks 814.

FIG. 8B shows moldable material 812 injected through opening 808 of first mold portion 800*a* and into mold cavity 804. Pressure P exerted on moldable material deforms workpiece 802 such that workpiece 802 conforms to second mold portion 800*b*, including within mold feature 810. Pressure P should be sufficiently high and/or moldable material 812 should have sufficiently low viscosity such that moldable material 812 at least partially flows within mechanical interlocks 814. In some cases, moldable material 812 is substantially fully molded within mechanical interlocks 814. If mechanical interlocks 814 have undercut geometries, moldable material 812 engages with internal surfaces of mechanical interlocks 814, further securing moldable material 812 to workpiece 802. Once hardened, molded material 812 is permanently bonded to the workpiece 802 since separation may be destructive to moldable material 812 or workpiece 802.

Figure 9A:
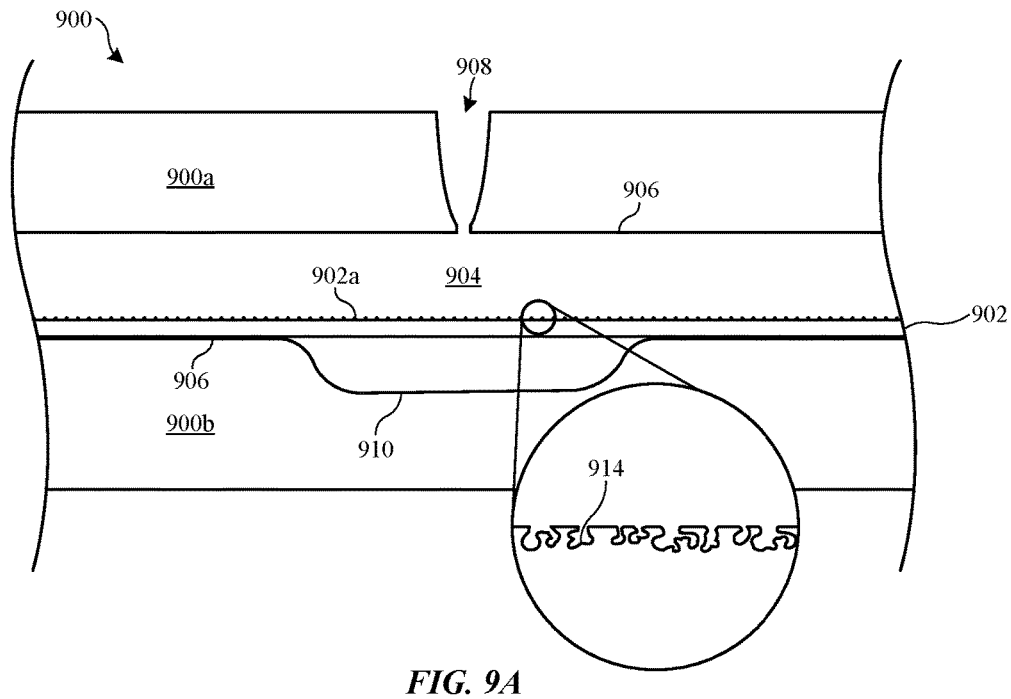
FIGS. 9A-9B show cross-section views of a composite part having micro-pore interlocks being formed using a molding process in accordance with some described embodiments.
Figure 9B:
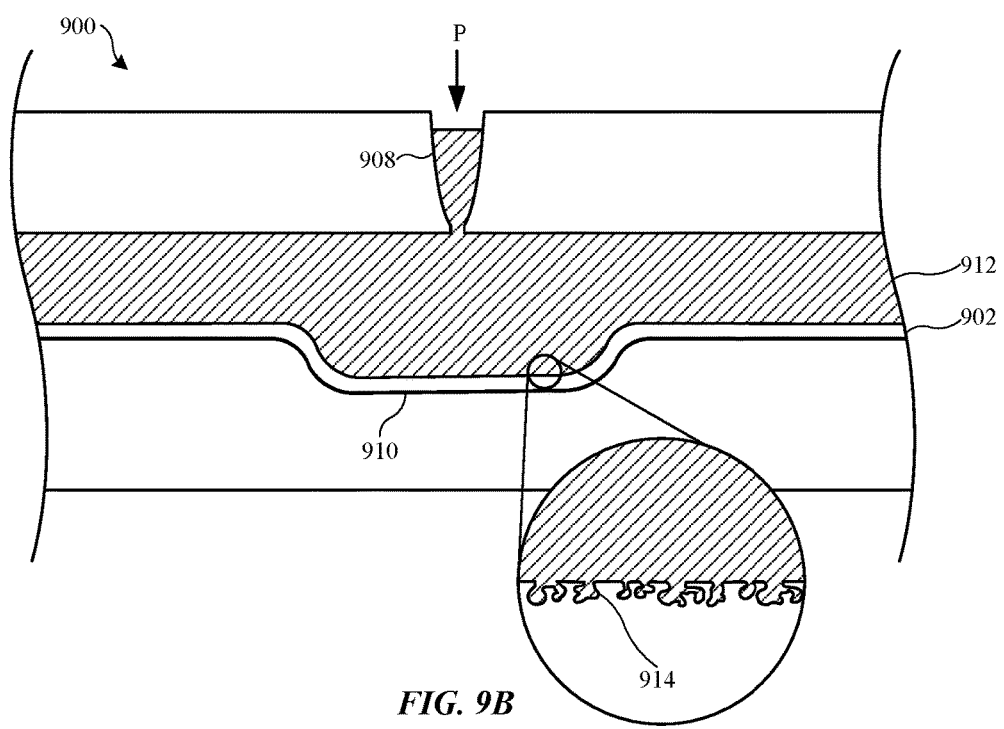

In further embodiments, the mechanical interlocks are on the scale of nanometers as shown in FIGS. 9A and 9B. FIG. 9A shows workpiece 902 having micro-pore interlocks 914 positioned between first mold portion 900*a* and second mold portion 900*b* of mold 900 prior to injection molding. Micro-pore interlocks 914 can be formed using, for example, chemical or laser etching, mechanical techniques (e.g., pitting or blasting), and/or thermal processes. These methods can be used to form micro-pore interlocks 914 having engagement features (divots and protrusions) on the scale of nanometers. Micro-pore interlocks 914 can have irregular shapes caused by the micro-pore interlocks 914 forming process. In some cases, the irregular shapes of the micro-pore interlocks 914 can further strengthen the bond between workpiece 902 and moldable material 912.

During the molding process, at FIG. 9B, moldable material 912 is injected through opening 908 into mold cavity 904 at prescribed pressure P. Moldable material 912 is injected at a sufficient pressure to deform workpiece 902 such that workpiece 902 conforms to cavity walls 906 and mold feature 910. Moldable material 912 flows into micro-pores interlocks 914, bonding to the increased surface area of surface 902*a* of workpiece 902. The viscosity of moldable material 912 should be sufficiently low and/or pressure P should be sufficiently high such that moldable material 912 at least partially flows within micro-pores interlocks 914. Controlling a heating of moldable material 912 can further control the viscosity of moldable material 912.

Figure 10A:
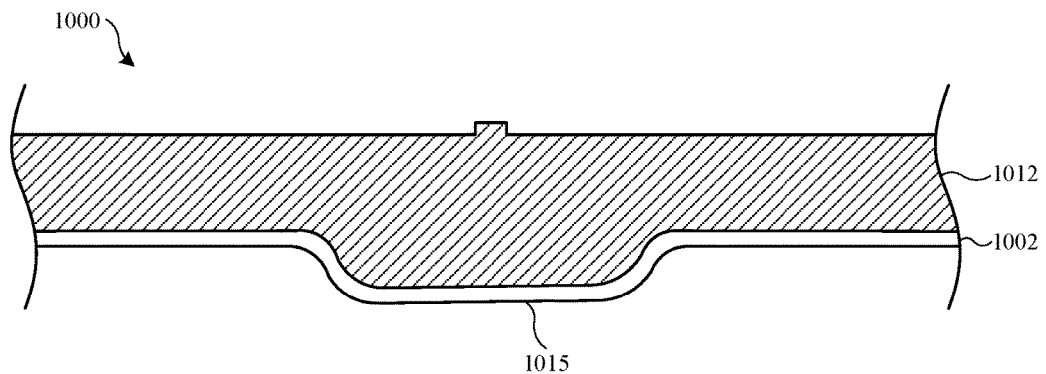
FIGS. 10A-10B show cross-section views of a composite part having functional features being formed using a molding process in accordance with some described embodiments.
Figure 10B:
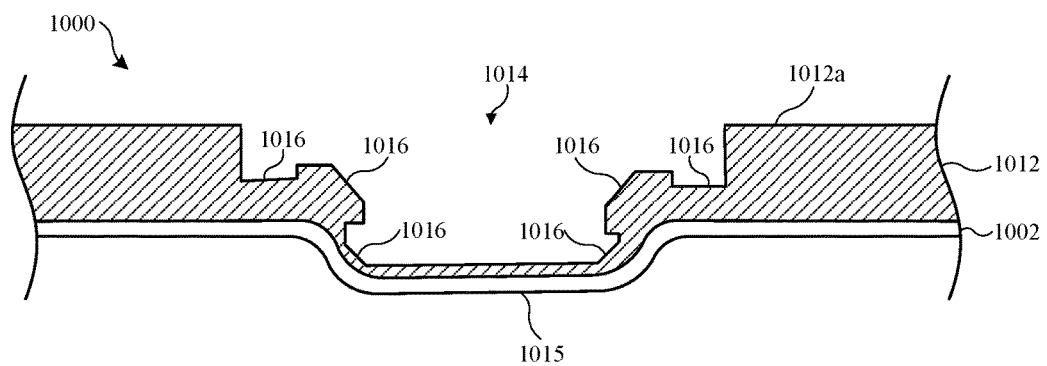

FIGS. 10A and 10B show composite part 1000 includes functional features, in accordance with some embodiments. Composite part 1000 includes moldable material 1012 and workpiece 1002 having feature 1015 formed thereon using one or more of the molding processes described above. At FIG. 10B, functional feature 1014 is formed from within surface 1012*a* of moldable material 1012 using, for example, a machining process. In some embodiments, functional feature 1014 is formed within an area of moldable material 1012 defined by feature 1015. That is, functional feature 1014 can have a shape roughly corresponding to a shape of feature 1015, as shown in FIG. 10B. Functional feature 1014 can include various facets 1016, which can have certain functional purposes for composite part 1000. For example, facets 1016 can mate with or otherwise engage with a corresponding part. In some embodiments, composite part 1000 is a device housing and functional feature 1014 can be used to couple composite part 1000 to other housing components or internal device components. Feature 1015 can increases the thickness of composite part 1000 allowing for a larger functional feature 1014 to be formed in moldable material 1012.

Figure 11A:
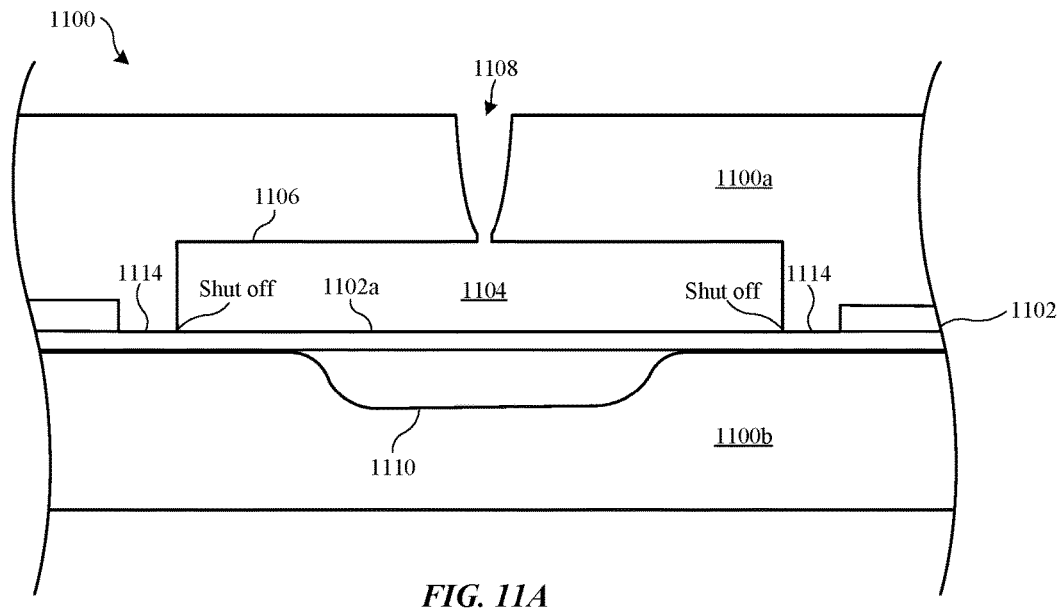
FIGS. 11A-11B show cross-section views of a composite part formed using a molding process using a mold with segregation features, in accordance with some described embodiments.
Figure 11B:
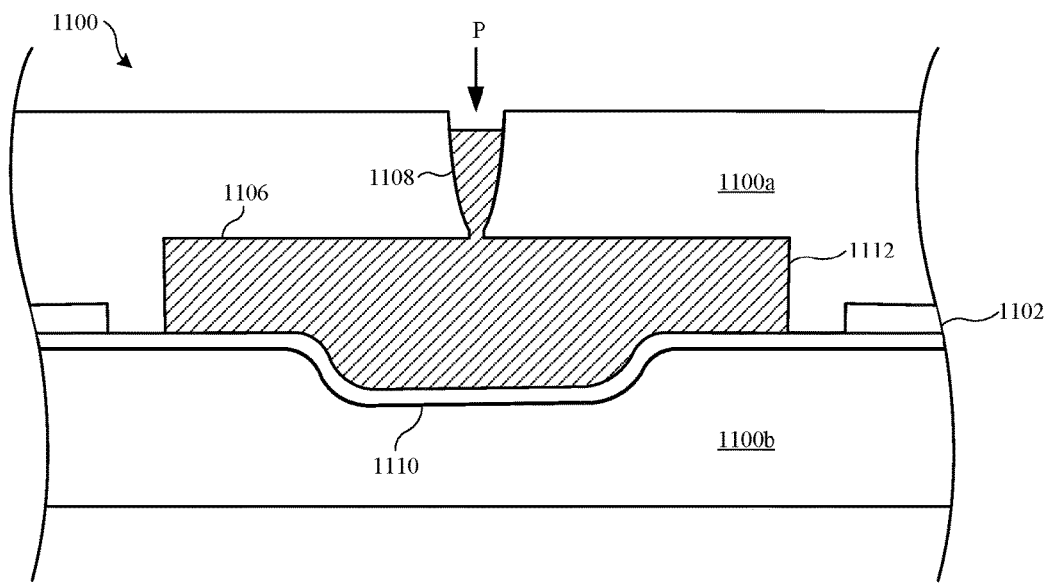

In some embodiments, the molding process includes methods to segregate the deformation of the workpiece into different areas. FIGS. 11A and 11B show mold 1100 having segregation features 1114 that define an area of workpiece 1102 affected by the molding process. At FIG. 11A, workpiece 1102 is situated between first mold portion 1100a and second mold portion 1100b of mold 1100. First mold portion 1100a has segregation features 1114 that contact surface 1102a of workpiece 1102 during the molding process forming "Shut offs" as shown in FIG. 11A. In some embodiments, segregation features 1114 function as locators, interacting with features in workpiece 1102 to locate workpiece 1102 within mold 1100.

At FIG. 11B, moldable material 1112 is injected at pressure P into opening 1108 defined by workpiece 1102 and first mold portion 1100a, which includes segregation features 1114. Moldable material 1112 is restrained within cavity 1104 by segregation features 1114 and exerts pressure P only on a portion of workpiece 1102 within cavity 1104. This portion of workpiece 1102 can be referred to as a mold-formed zone. Restricting the flow of moldable material 1112 allows for a reduction in pressure exerted on workpiece 1102 away from mold feature 1110. In this way, moldable material 1112 bonds to workpiece 1102 only in the area defined by segregation features 1114.

Figure 12A:
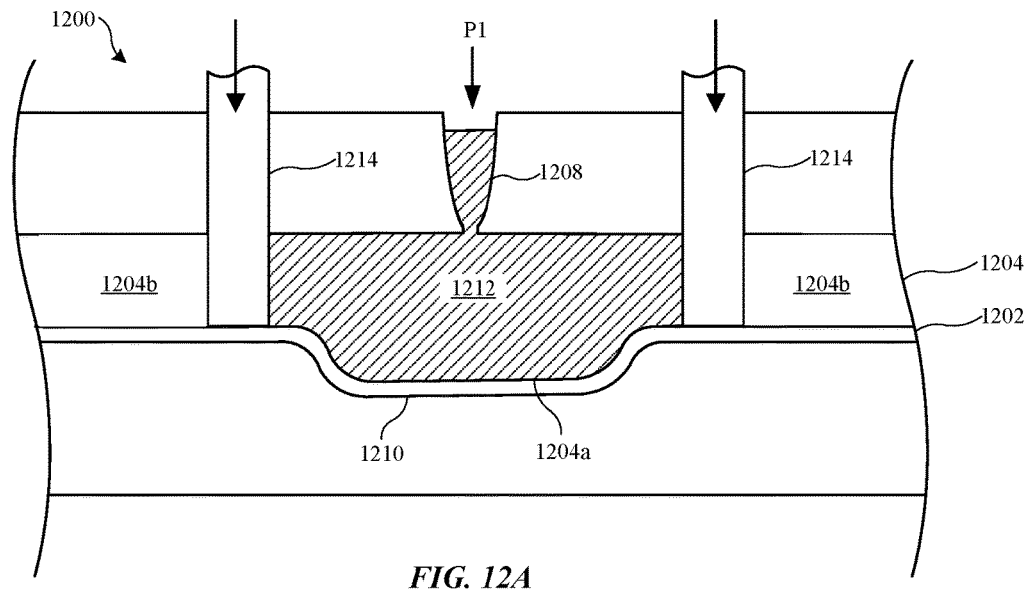
FIGS. 12A-12B show cross-section views of a composite part formed using a molding process using a mold with shutoff valves, in accordance with some described embodiments.
Figure 12B:
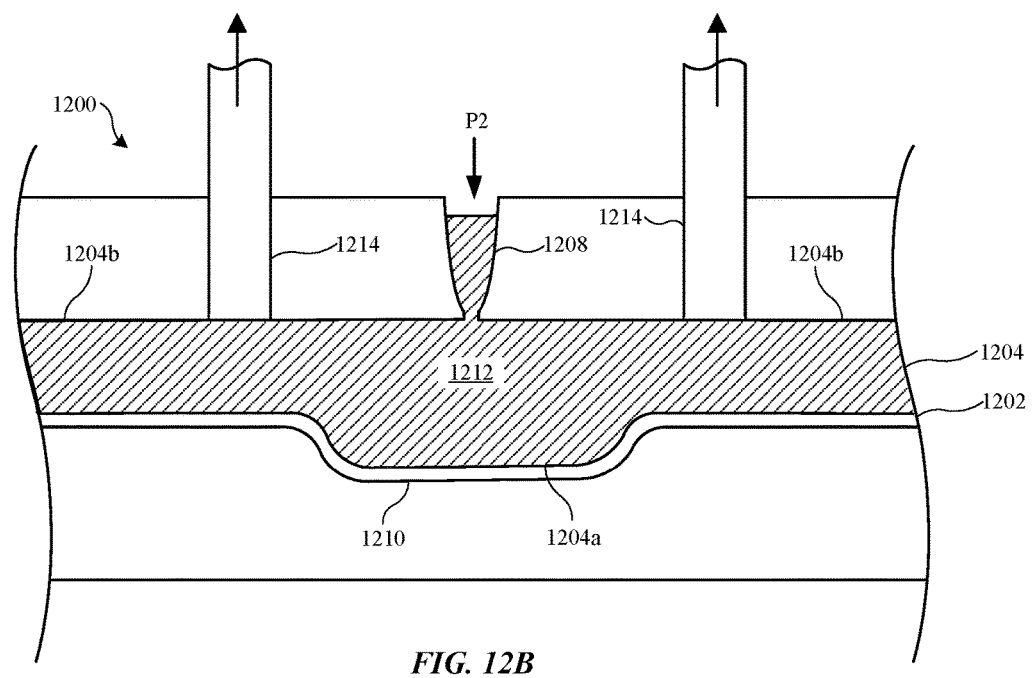

In some embodiments, it is desirable to deform only a portion of a workpiece within a mold to alleviate unnecessary pressure on areas of workpiece that do not require deformation. FIGS. 12A and 12B shows mold 1200 having shutoff valves 1214 that can be manipulated to control the flow of moldable material 1212 within mold 1200 in conjunction with opening 1208. In particular, shutoff valves 1214 can be manipulated mid-cycle to control the flow of moldable material 1212. FIG. 12A shows shutoff valves 1214 in a closed state and FIG. 12B shows shutoff valves 1214 in on open state. Shutoff valves 1214 can be slideably moved between a closed state (FIG. 12A) and an open state (FIG. 12B).

At FIG. 12A, shutoff valves 1214 are in a closed state. Shutoff valves 1214 can be positioned on surface 1202a of workpiece 1202 so as to constrain the flow of moldable material 1212 within region 1204a of the mold cavity. As such, moldable material 1212 exerts pressure only on the portion of workpiece 1202 over and/or around mold feature 1210. During this initial injection process, pressure P1 of moldable material 1212 deforms workpiece 1202 in conformance with mold feature 1210.

Once workpiece 1202 has been sufficiently deformed in accordance with mold feature 1210, at FIG. 12B shutoff valves 1214 are moved to an open state. This allows moldable material 1212 to flow within region 1204a as well as region 1204b of the mold cavity, completing the formation of the composite part. Pressure P2 of moldable material 1212 can be different than P1 during the initial injection process of FIG. 12A. For example, pressure P1 during the initial injection can be higher than pressure P2 during the subsequent injection. This higher pressure P1 can be sufficient to cause workpiece 1202 to deform and conform sufficiently to mold feature 1210. Once a desired deformation has been achieved, a lower pressure P2 allows for moldable material 1212 to flow into region 1204b of the mold cavity to bond moldable material 1212 with surface 1202a of workpiece 1202.

Figure 13A:
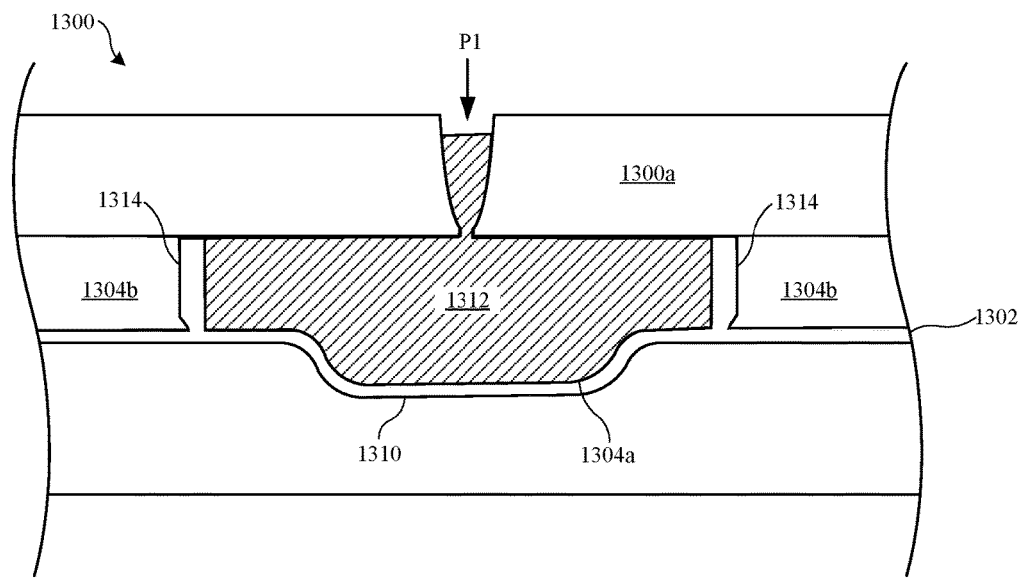
FIGS. 13A-13B show cross-section views of a composite part formed using a molding process using a mold with sacrificial relief valves, in accordance with some described embodiments.
Figure 13B:
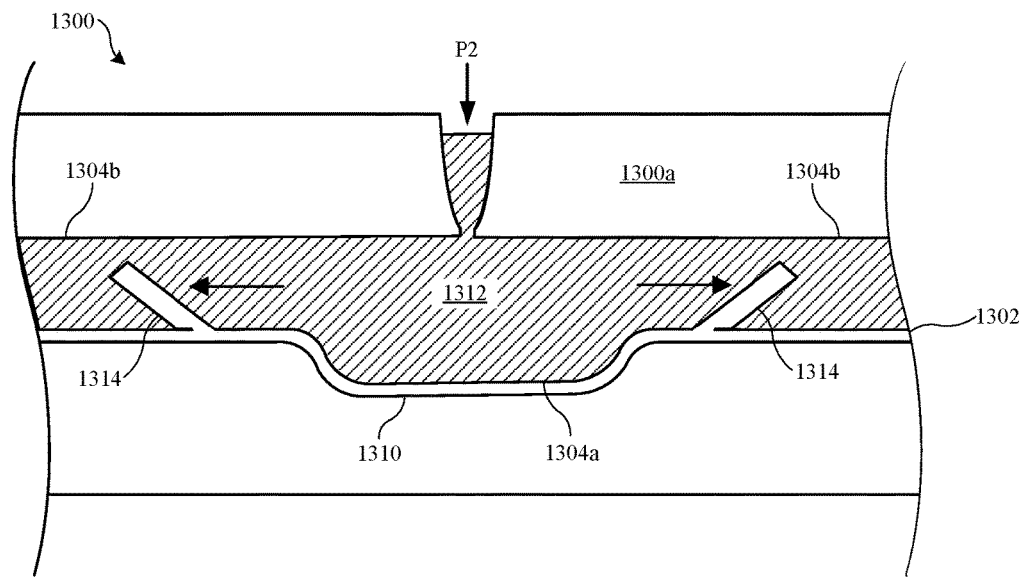

In some embodiments a sacrificial relief valve is used to control pressure and control the flow of moldable material. FIGS. 13A and 13B show mold 1300 with sacrificial relief valves 1314. FIG. 13A shows sacrificial relief valves 1314 in an intact state and FIG. 12B shows sacrificial relief valves 1314 in a buckled state. At FIG. 13A, sacrificial relief valves 1314 close off region 1304a such that moldable material 1312 flows in to region 1304a of the mold cavity. Moldable material 1312 is applied at pressure P1. Sacrificial relief valves 1314 can be coupled to or part of workpiece 1302. For example, sacrificial relief valves 1314 can be integrally formed with workpiece 1302 and be made of the same material as workpiece 1302. In other embodiments, sacrificial relief valves 1314 are adhered to workpiece 1302 using an adhesive, welding or other fastening mechanism. In some embodiments, sacrificial relief valves 1314 are part of mold portion 1300a of mold 1300.

Sacrificial relief valves 1314 can be shaped to yield and buckle when the pressure of moldable material 1312 reaches a pressure P2, as shown in FIG. 13B. This allows moldable material to flow into region 1304b of the mold cavity. In some embodiments, sacrificial relief valves 1314 have tapered bottom portions, as shown, that are designed to yield in a direction in accordance with the flow (indicated by arrows) of moldable material 1312. Pressure P2 at which sacrificial relief valves 1314 yield can be greater than pressure P1 at which deformation of workpiece 1302 in conformance with mold feature 1310 occurs. For example, sacrificial relief valves 1314 can restrain moldable material 1312 at pressure P1 sufficient to deform workpiece 1302 in conformance with mold feature 1310. Then, the pressure is increased to P2 sufficient to cause sacrificial relief valves 1314 to yield. In some embodiments, sacrificial relief valves 1314 remain attached to workpiece 1302 after yielding. In some embodiments, sacrificial relief valves 1314 are insert molded features of the resultant composite part. In other embodiments, sacrificial relief valves 1314 decouple from workpiece 1302 when buckled, or are removed from the composite part after the molding process is complete.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A method of forming a composite part, the method comprising:
   positioning a workpiece within a mold cavity of a mold;
   closing a valve within the mold cavity to at least partially define an enclosed portion of the mold cavity, the enclosed portion being less than an entirety of the mold cavity;
   while the valve is closed, injecting a first amount of a moldable material into the enclosed portion of the mold cavity, thereby filling the enclosed portion and deforming a portion of the workpiece against a wall of the mold;
   opening the valve;
   while the valve is open, injecting a second amount of the moldable material into the mold cavity; and
   hardening the first amount and the second amount of the moldable material, thereby bonding the moldable material to the workpiece.

2. The method of claim 1, further comprising, prior to the operation of injecting the first amount of the moldable material, preconditioning the workpiece such that the workpiece is more deformable.

3. The method of claim 2, wherein the preconditioning includes heating the workpiece or chemically treating the workpiece.

4. The method of claim 1, wherein the workpiece includes at least one of metal, a polymer material, glass, ceramic, or a composite material.

5. The method of claim 1, wherein the moldable material includes of one or more of metal, a polymer material, glass, ceramic, or a composite material.

6. The method of claim 1, wherein the workpiece includes a same material as the moldable material.

7. The method of claim 1, wherein the workpiece includes a different material than the moldable material.

8. The method of claim 1, wherein the mold wall includes a protruding feature.

9. The method of claim 1, further comprising, after the operation of injecting the second amount of the moldable material, removing at least a portion of the moldable material from the composite part.

10. The method of claim 1, wherein:
the mold comprises multiple valves within the mold cavity; and
the enclosed portion of the mold cavity is further defined by the multiple valves when the multiple valves are in a closed state.

11. A method of forming a composite part, the method comprising:
while a valve within a mold cavity is closed, injecting a polymer material at a first pressure into a first region of the mold cavity, the first region separated from a second region of the mold cavity by the valve, thereby deforming a workpiece within the mold cavity;
changing a position of the valve; and
after changing the position of the valve, injecting the polymer material at a second pressure, less than the first pressure, into the first region and the second region of the mold cavity.

12. The method of claim 11, wherein the polymer material bonds with the workpiece.

13. The method of claim 11, wherein the workpiece includes at least one of metal, a polymer material, glass, ceramic, or a composite material.

14. The method of claim 11, wherein:
the mold cavity is a first mold cavity; and
the method further comprises:
removing the composite part from the first mold cavity;
positioning the composite part within a second mold cavity, wherein the polymer material is a first polymer material; and
injecting a second polymer material into the second mold cavity such that the second polymer material bonds with the first polymer material.

15. The method of claim 11, further comprising: removing the composite part from the mold cavity; and performing a machining operation or a surface finishing operation on the composite part.

16. The method of claim 11, wherein the composite part is an enclosure for an electronic device, wherein the workpiece corresponds to a cosmetic exterior coating of the enclosure.

17. A method of forming a composite part, comprising:
positioning a workpiece within a mold cavity of a mold, the workpiece comprising a gate feature projecting into the mold cavity and separating the mold cavity into a first molding region and a second molding region;
injecting a first amount of a polymer at a first pressure into the mold cavity, thereby:
molding a region of the workpiece within the first molding region against a feature of the mold; and
bending the gate feature to join the first molding region and the second molding region; and
injecting a second amount of the polymer at a second pressure, less than the first pressure, into the mold cavity.

18. The method of claim 17, wherein the workpiece is formed of a metal.

19. The method of claim 17, wherein the gate feature is integrally formed with the workpiece.

20. The method of claim 17, wherein the gate feature is fastened to the workpiece.

* * * * *